US00RE37102E

(19) United States
(12) Reissued Patent
Tada

(10) Patent Number: US RE37,102 E
(45) Date of Reissued Patent: Mar. 20, 2001

(54) SAW FILTER WITH SPECIFIED ELECTRODE DIMENSIONS

(75) Inventor: Yutaka Tada, Kanazawa (JP)

(73) Assignee: Murata Manufacturing Co, Ltd (JP)

(21) Appl. No.: 09/238,947

(22) Filed: Jan. 27, 1999

Related U.S. Patent Documents

Reissue of:
(64) Patent No.: 5,731,748
Issued: Mar. 24, 1998
Appl. No.: 08/728,736
Filed: Oct. 11, 1996

U.S. Applications:

(63) Continuation of application No. 08/414,205, filed on Mar. 31, 1995, now abandoned.

(30) Foreign Application Priority Data

Apr. 13, 1994 (JP) ..... 6-074830

(51) Int. Cl.[7] ..... H03H 9/145; H03H 9/64
(52) U.S. Cl. ..... 333/193; 310/313 B; 310/313 D
(58) Field of Search ..... 333/193–196; 310/313 R, 313 B, 313 C, 313 D, 313 A

(56) References Cited

U.S. PATENT DOCUMENTS

| | | | |
|---|---|---|---|
| 3,952,268 | 4/1976 | Schulz et al. | 333/155 |
| 4,978,879 | 12/1990 | Satoh et al. | 310/313 A |
| 5,223,762 | 6/1993 | Masaie et al. | 310/313 D |
| 5,256,927 | 10/1993 | Kato et al. | 310/313 B |
| 5,270,606 | 12/1993 | Cho et al. | 310/313 D |
| 5,300,902 | 4/1994 | Satoh et al. | 333/193 |
| 5,432,392 | 7/1995 | Kadota et al. | 310/313 A |
| 5,434,465 | 7/1995 | Sato et al. | 310/313 A |
| 5,559,481 | 9/1996 | Satoh et al. | 333/194 |

FOREIGN PATENT DOCUMENTS

| | | |
|---|---|---|
| 4115080C2 | 11/1992 | (DE) . |
| 4132309A1 | 4/1993 | (DE) . |
| 2-250415 | 10/1990 | (JP) . |
| 4-40705 | 2/1992 | (JP) . |
| 4253412 | 9/1992 | (JP) . |
| 5-121996 | 5/1993 | (JP) . |
| 5-251988 | 9/1993 | (JP) . |
| 7-30363 | 7/1995 | (JP) . |

*Primary Examiner*—Benny Lee
*Assistant Examiner*—Barbara Summons
(74) *Attorney, Agent, or Firm*—Keating & Bennett LLP

(57) ABSTRACT

A surface acoustic wave filter has pairs of interdigital transducers and reflectors formed on a 36° Y-X $LiTaO_3$ substrate, the reflectors sandwiching the interdigital transducers in between. The film thickness h of the electrode fingers of the interdigital transducers and the reflectors is such that $0.06 \leqq h/\lambda \leqq$ [0.01] *0.10* where $\lambda$ is the wavelength of the surface acoustic wave adapted to be generated by the filter. The width-to-pitch ratio M/P of these electrode fingers for the interdigital transducers and the reflectors is such that $M/P \geqq 0.6$ in order to improve the shape factor of the filter.

20 Claims, 4 Drawing Sheets

SAW FILTER WITH SPECIFIED ELECTRODE DIMENSIONS

Matter enclosed in heavy brackets [ ] appears in the original patent but forms no part of this reissue specification; matter printed in italics indicates the additions made by reissue.

This a continuation of application Ser. No. 08/414,205 filed Mar. 31, 1995, now abandoned.

BACKGROUND OF THE INVENTION

This invention relates to a surface acoustic wave (SAW) filter having interdigital transducers (IDTs) and reflectors formed on a piezoelectric substrate.

SAW filters are coming to be used in communication equipment of different types for providing compact apparatus. For use in a portable telephone, however, filters having a wide passband of over 25 MHz and a low level of insertion loss are required. Examples of prior art SAW filter satisfying such requirements, and in particular the requirement of a wide passband, include those using a 36° rotation Y cut X propagation (Y-X) $LiTaO_3$ substrate or a 64° Y-X $LiNbO_3$ substrate (referred to, for example, in U.S. Pat. No. 5,300,902) with a large electro-mechanical coefficient.

Among SAW filters using a 36° Y-X $LiTaO_3$ substrate, designs such as the ladder type and the interdigitated interdigital transducer (IIDT) type are actually being used. With SAW filters of an ordinary type using mode coupling, however, a band width of only about 2% of the frequency at the center can be obtained. Since a ratio of at least 3% is required between the band width and the center frequency for a portable telephone, these filters are not useful for practical application.

SAW filters using a 64° Y-X $LiNbO_3$ substrate, on the other band, have been in use for portable telephones because a ratio of about 4% is obtainable with them between the band width and the center frequency. Neither are these filters practical, however, because they are not easy to manufacture and their production cost is high.

Explained more in detail, SAW filters used in a portable telephone have a stop band at least on one side of its passband, that is, at least either on its low frequency side or on its high frequency side, and a certain level of attenuation must be provided within such a stop band or bands (usually over 20 dB). In other words, filters which have a good shape factor (defined as the ratio between the passband width and the attenuation band width) and are easy to manufacture are those having a narrow band width at attenuation of 20 dB.

FIG. 8 is a frequency characteristic of a prior art SAW filter using a 64° Y-X $LiNbO_3$ substrate designed for use in a mobile communication system requiring a SAW filter with central frequency $f_o$ of 947.5 MHz on the side of the reception circuit for its portable unit. In order to prevent interference from waves of reception frequencies within 45 MHz of the central frequency $f_o$ on its lower frequency side, this filter should preferably have attenuation of over 20 dB within a stop band of 902.5±12.5 MHz (hereinafter referred to as the lower-frequency side stop band C). For image suppression on the higher frequency side, furthermore, this filter should preferably also have attenuation of over 20 dB within another stop band of 992.5±12.5 MHz (hereinafter referred to as the higher-frequency side stop band C).

Since the central frequencies of SAW filters are not exactly the same but fluctuate due to variations in their production conditions, their attenuation characteristics also vary from one product to another. In order to maintain attenuation levels greater than 20 dB on both the lower and higher frequency sides, therefore, a control with correspondingly high level of accuracy is required regarding frequency.

Although it may be ideal to have the central frequency of a SAW filter approximately in the middle between its lower-frequency and higher-frequency side stop bands C and C', as shown in FIG. 8, in order to obtain high attenuation on both the lower and high frequency sides, attenuation over 20 dB can be obtained even when changes at the central frequency may be big if the band width A at attenuation level of 20 dB is narrow. In other words, the band width at attenuation of 20 dB plays an important role in obtaining attenuation of over 20 dB on both the lower-frequency and high-frequency sides of the central frequency.

In the example shown in FIG. 8, the allowance for production errors (width of allowed frequency variations) on the lower-frequency side is represented by the frequency difference between Points X and Y, and its magnitude is obtained by subtracting the half width at attenuation level of 20 dB (28 MHz) and the half width of the lower-frequency side stop band C (12.5 MHz) from the frequency difference B (=45 MHz) between the centers of the stop band and the passband. In the example shown in FIG. 8, this is calculated to be 4.5 MHz but, since the frequencies of SAW filters normally fluctuate by about ±3 MHz from normal-temperature value as temperature changes within a range of, say, −25 to 75° C., this is usually subtracted from the calculated value and 4.5−3=1.5 MHz is regarded as the allowance for production errors on the lower-frequency side. The production error allowance on the higher-frequency side is similarly calculated to be 1.5 MHz.

Since the central frequency of a filter depends heavily on the thickness of its film electrodes and the width of its electrode lines, however, a production error allowance of 1.5 MHz on each side is not sufficient, and it becomes necessary to strictly control the thickness of the film electrodes and the width of the electrode lines for each production lot. This makes the production difficult and has the adverse effect of increasing the production cost.

SUMMARY OF THE INVENTION

It is therefore an object of this invention to provide a SAW filter which can be manufactured easily such that its production cost can be reduced.

A SAW filter according to this invention, with which the above and other objects can be accomplished, may be characterized not only as having a plurality of pairs of IDTs closely disposed on a 36° Y-X $LiTaO_3$ substrate and reflectors on both sides of the IDTs, but also wherein the thickness h of the electrode films for the IDTs and the reflectors and the wavelength $\lambda$ of the surface wave generated by this filter are such that $0.06 \leqq h/\lambda \leqq 0.10$. If the width of the fingers belonging to these IDTs and the reflectors is M and their pitch is P, it is preferred that $0.6 \leqq M/P$.

BRIEF DESCRIPTION OF THE DRAWINGS

The accompanying drawings, which are incorporated in and form a part of this specification, illustrate embodiments of the invention and, together with the description, serve to explain the principles of the invention. In the drawings.

Throughout herein, components which are substantially alike are indicated by the same numerals, as between FIGS. 1 and 6, and are not necessarily described repetitively.

DETAILED DESCRIPTION OF THE INVENTION

Figure 1:
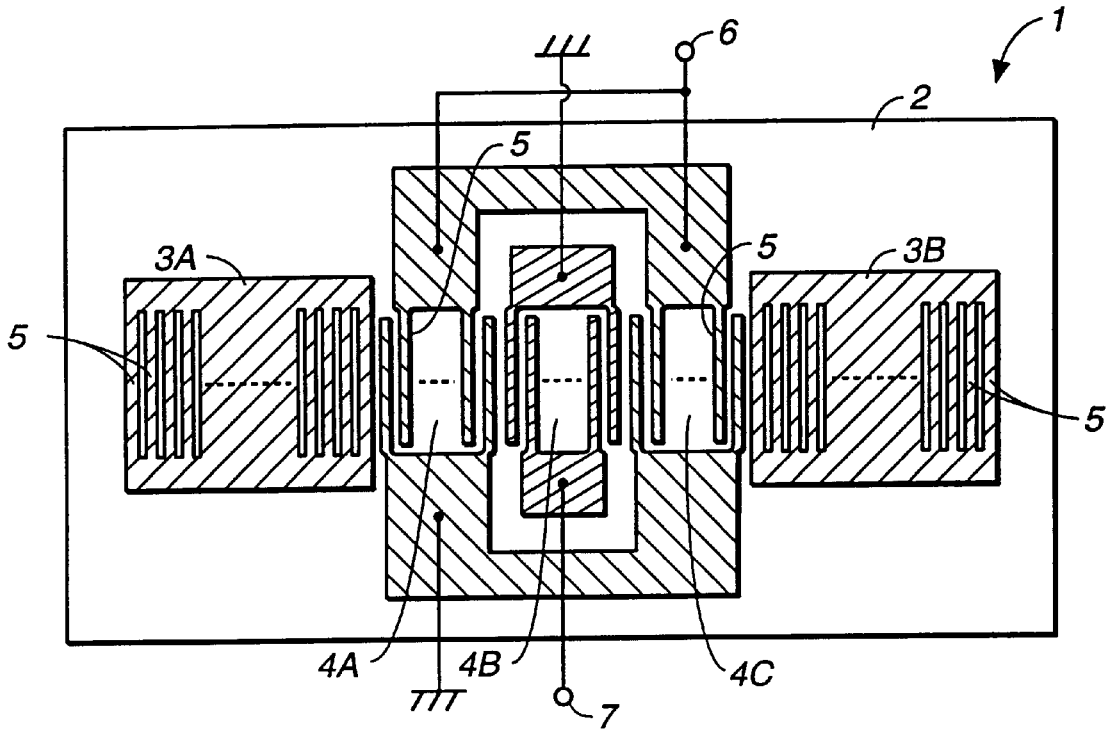
FIG. 1 is a plan view showing the general structure of a SAW filter according to this invention.
Figure 2:
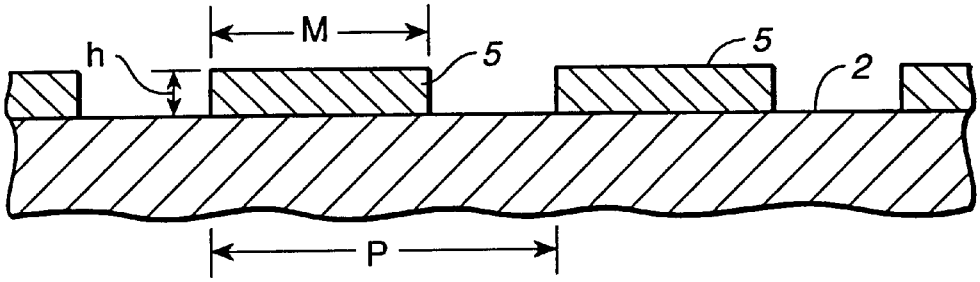
FIG. 2 is an enlarged sectional view of a portion of IDT or reflector part of a SAW filter according to the first and second embodiments of this invention.

FIGS. 1 and 2 show some common structural characteristics of SAW filters 1 according to this invention. Reflectors 3A and 3B are formed on a surface of a 36° Y-X $LiTaO_3$ substrate 2 with three IDTs 4A, 4B and 4C of a known type formed sequentially arranged therebetween. The reflectors 3A and 3B and the IDTs 4A, 4B and 4C are each comprised of a plurality of what will hereinafter be referred to as electrode fingers 5 which are elongated electrodes arranged mutually parallel, as disclosed, for example, in U.S. Pat. No. 5,223,762. The two IDTs 4A and 4C at both ends are electrically connected to each other in parallel and connected to an input/output terminal 6, while the IDT 4B in the middle therebetween is connected to a separate input/output terminal 7. Each of these reflectors 3A and 3B and IDTs 4A, 4B and 4C may be formed by first forming a thin Al film on the 36° Y-X $LiTaO_3$ substrate 2 and then photo-etching the formed film. They may alternatively be formed by selective deposition, for example, by a so-called "lift-off" method.

A SAW filter 1 thus formed according to this invention is characterized as having the thickness of the electrode film for the IDTs 4A, 4B and 4C and the reflectors 3A and 3B determined according to the wavelength of the SAW generated thereby. Explained more in detail, if the film thickness of the electrode fingers 5 of the IDTs 4A, 4B and 4C and the reflectors 3A and 3B is h and the wavelength of the SAW generated by the filter 1 is λ, the thickness-to-wavelength ratio h/λ according to this invention is equal to or greater than 0.06 but not greater than 0.10, that is, $0.06 \leqq h/\lambda \leqq 0.10$. According to this invention, the production error allowance is thereby increased such that the production becomes easier and the production cost can be reduced.

Figure 3:
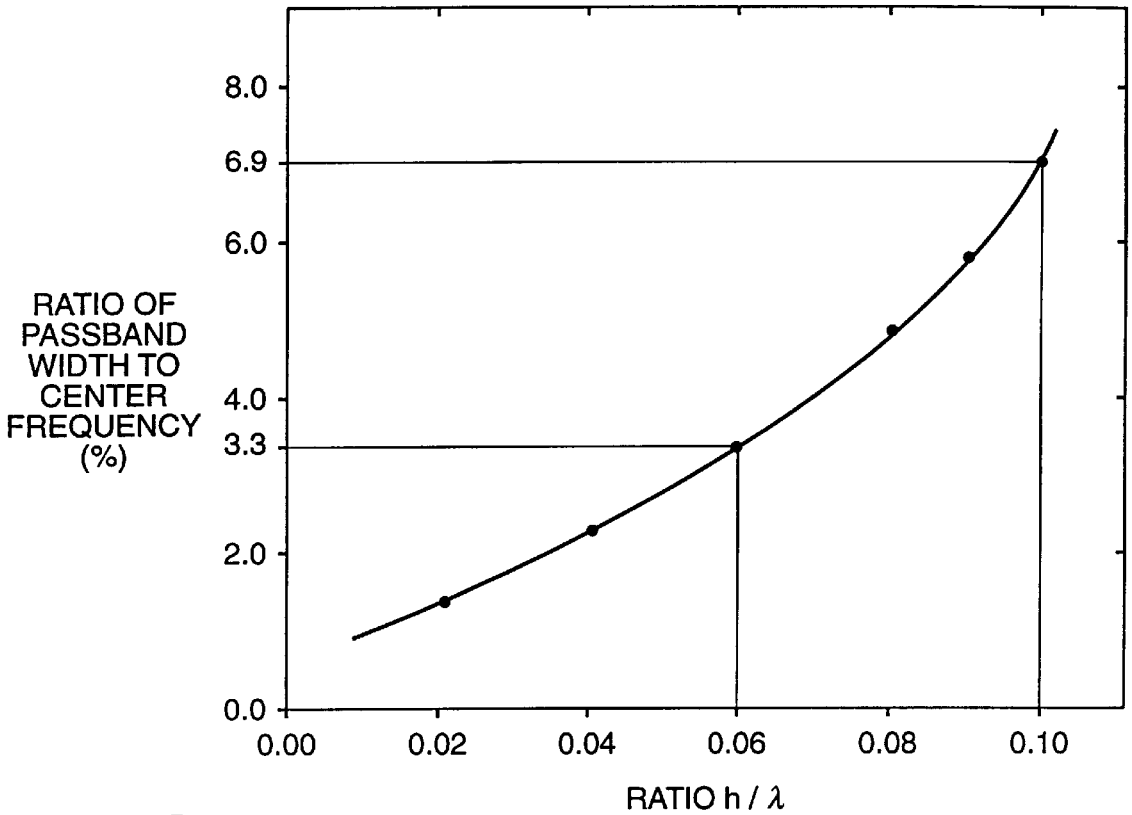
FIG. 3 is a graph which shows the relationship between the ratio h/λ and the passband width-to-center frequency ratio of a SAW filter.

In summary, SAW filters using a 36° Y-X $LiTaO_3$ substrate, instead of a 64° Y-X $LiNbO_3$ substrate, have been known to have an improved Q value for their resonators and an improved shape factor, although prior art SAW filters of this type could not provide a sufficiently large passband width for use in a portable telephone, as explained above. For portable telephones operating in a 900 MHz band, for example, a passband with width of at least 30 MHz is required if effects of temperature variations are to be taken into consideration. In other words, a passband width-to-central frequency ratio of about 3.3% is required. The present invention is based on the discovery that the stop band of the reflectors 3A and 3B becomes wider and the width of the passband can be increased if the thickness h of the electrode film of the IDTs 4A, 4B and 4C and the reflectors 3A and 3B is increased. FIG. 3 shows results of an experiment measuring the passband width-to-center frequency ratio as the thickness-to-wavelength ratio h/λ of a similar SAW filter was changed.

With prior art SAW filters of this type, the thickness-to-wavelength ratio h/λ was usually about 0.03. FIG. 3 shows that the thickness-to-wavelength ratio h/λ of a SAW filter using a 36° Y-X $LiTaO_3$ substrate must be increased by a factor of at least 2, or $h/\lambda \geqq 0.06$, in order to increase its passband width-to-center frequency ratio to 3.3% such that it can be used in a portable telephone.

Figure 8:
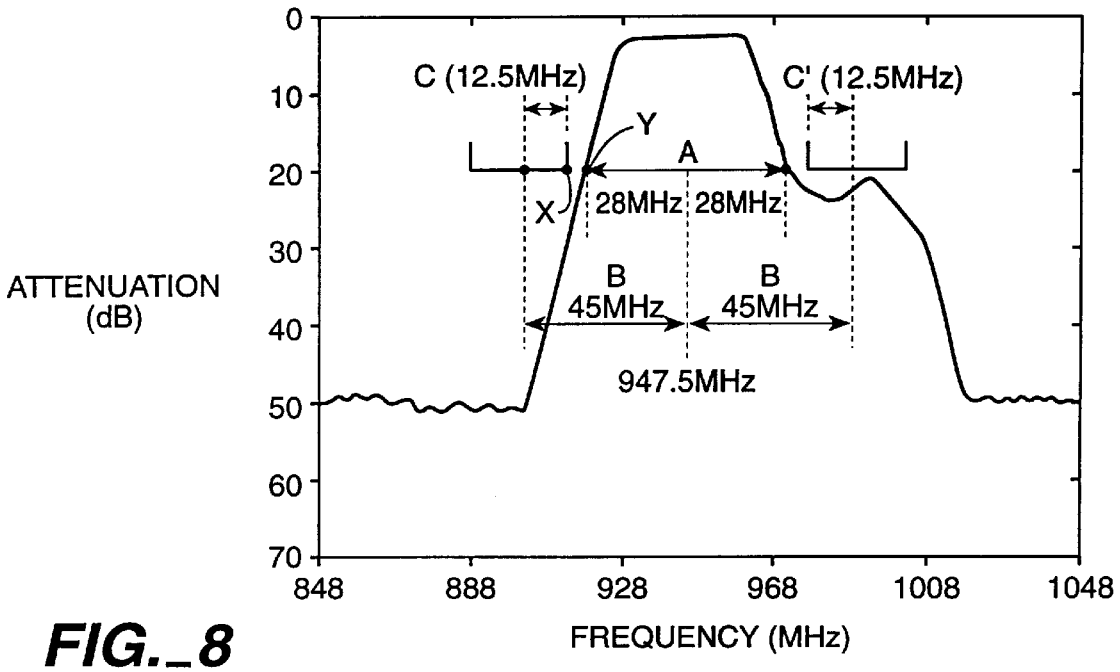
FIG. 8 (PRIOR ART)
FIG. 8 is a graph which shows a characteristic curve of a prior art SAW filter.

FIG. 3 also shows that the passband width-to-center frequency ratio keeps increasing correspondingly as the thickness-to-wavelength ratio h/λ is increased. If the thickness-to-wavelength ratio h/λ is increased excessively, however, the passband may overlap with the stop band on the lower-frequency side and/or the higher-frequency side, causing insufficient attenuation. Since separation between the stop bands on the lower-frequency and higher-frequency sides is about 65 MHz according to FIG. 8, it is not desirable to allow the passband width-to-center frequency ratio to be greater than 6.9%. In other words, the thickness-to-wavelength ratio h/λ must be no larger than 0.10 according to the experimental result shown in FIG. 3.

Figure 4:
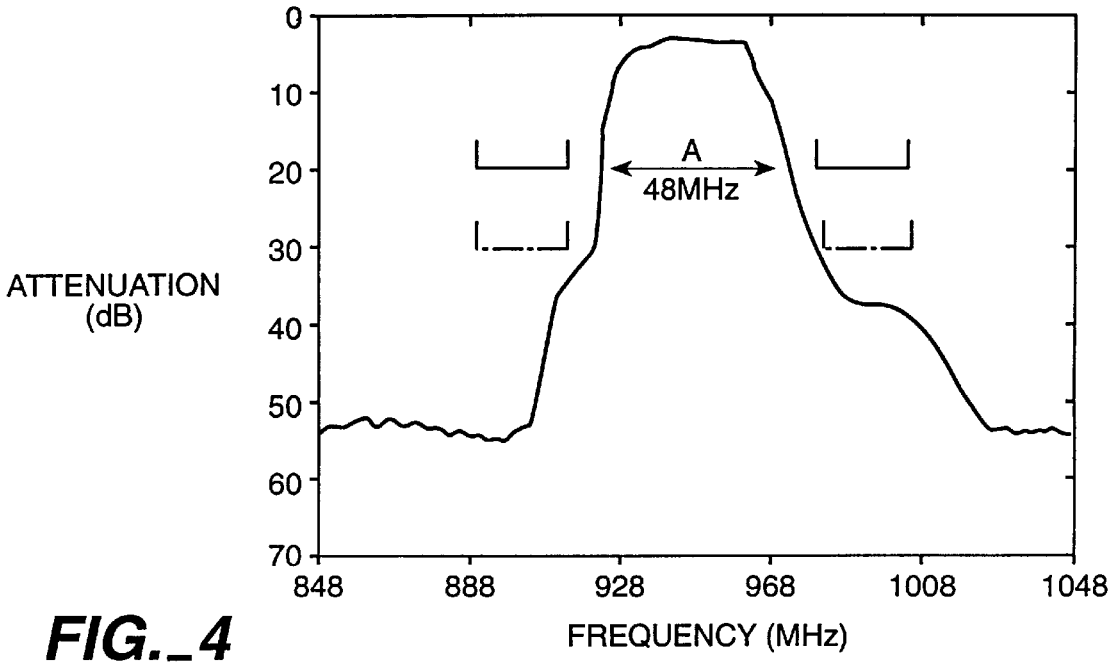
FIG. 4 is a graph which shows a characteristic curve of a SAW filter according to the first embodiment of this invention.

A SAW filter according to a first embodiment of this invention was manufactured with the thickness-to-wavelength ratio h/λ equal to 0.6 and its attenuation characteristic was measured. As shown in FIG. 4, the band width at the attenuation level of 20 dB was 48 MHz, which is an improvement by 8 MHz from the prior art example shown in FIG. 8. The production error allowance, calculated similarly as explained above, is 5.5 MHz on each side, which is larger than the prior art value by a factor of about 3.6 FIG. 4 also shows that the attenuation of nearly 30 dB is achieved.

Although the passband width can be increased by increasing the thickness h of the electrode film for the IDTs 4A, 4B and 4C and the reflectors 3A and 3B, the shape factor becomes bad if the reflectivity of the reflectors 3A and 3B increases and the stop bands become too wide. In view of the above, a SAW filter according to a second embodiment of this invention is characterized wherein the width of the electrode fingers 5 of its IDTs 4A, 4B and 4C and reflectors 3A and 3B is determined such that the shape factor of the filter will be improved. In all other respects, SAW filters according to the second embodiment of the invention are identical to one according to the first embodiment of the invention described above with reference to FIGS. 1 and 2, that is, they comprise a 36° Y-X $LiTaO_3$ substrate 2 on which are formed reflectors 3 and IDTs 4 each having a plurality of electrode fingers 5. The film thickness h of these electrode fingers 5 is again required to satisfy the condition $0.06 \leqq h/\lambda \leqq 0.10$ where λ indicates the wavelength of the SAW generated by the filter.

As shown in FIG. 2, let P and M respectively indicate the pitch and width of the electrode fingers 5 of the IDTs 4A, 4B and 4C and reflectors 3A and 3B. Then, a SAW filter according to the second embodiment of this invention is additionally characterized wherein their ratio M/P (that is, the width-to-pitch ratio which may also be referred to as "the electrode finger duty") is equal to or greater than 0.6, that is $0.6 \leqq M/P$. With the width-to-pitch ratio M/P thus selected, SAW filters according to the second embodiment of this invention can be produced more easily and at a reduced production cost.

Figure 5:
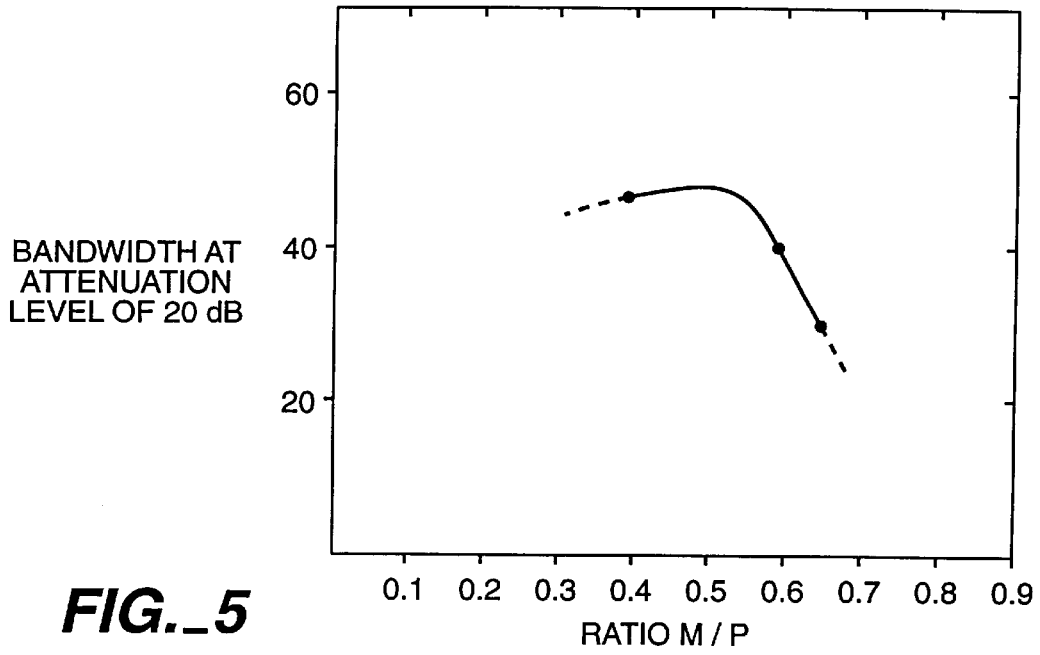
FIG. 5 is a graph which shows the relationship between the width-to-pitch ratio of the electrode fingers and the band width at attenuation of 20 dB of a SAW filter.

FIG. 5 shows results of another experiment carried out to measure the changes in band width at the attenuation level of 20 dB for a SAW filter according to this invention as the width-to-pitch ratio M/P of the electrode fingers was varied. FIG. 5 shows clearly that the band width at the attenuation level of 20 dB decreases and hence the shape factor improves as the width-to-pitch ratio M/P of the electrode fingers is increased. One can conclude from a further analysis that best results can be obtained if $M/P \geqq 0.6$.

FIG. 5 indicates that some improvement is obtainable even if the ratio M/P is below 0.4, but the improvement in this case is very small. Moreover, since the resistance of the electrode fingers becomes large and the insertion loss becomes worse if their width is reduced, it is not desirable to make the electrode fingers too narrow. Since the upper limit of the ratio M/P depends on the manufacturing technology of the electrode fingers (or the technology of forming gaps between electrode fingers), this invention does not set any value as the upper limit of this ratio.

Figure 6:
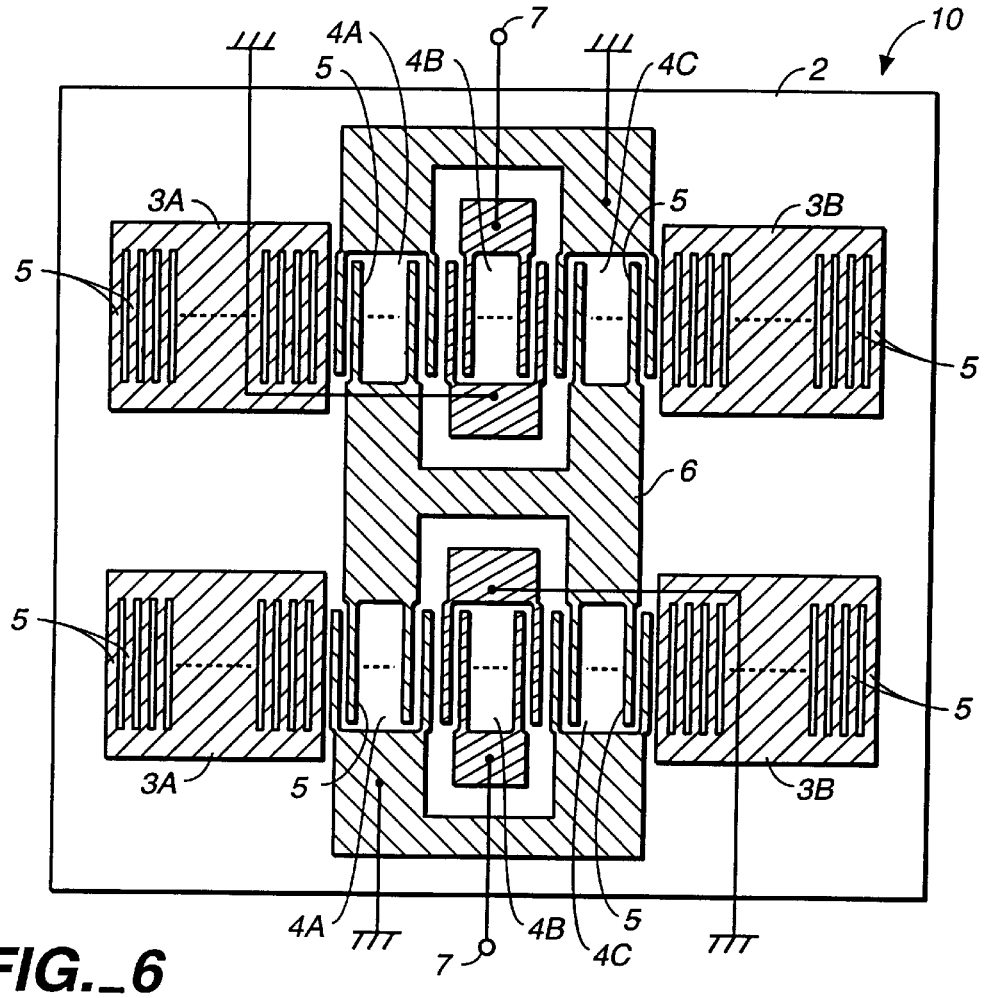
FIG. 6 is a plan view of another SAW filter according to this invention having two filter sections.
Figure 7:
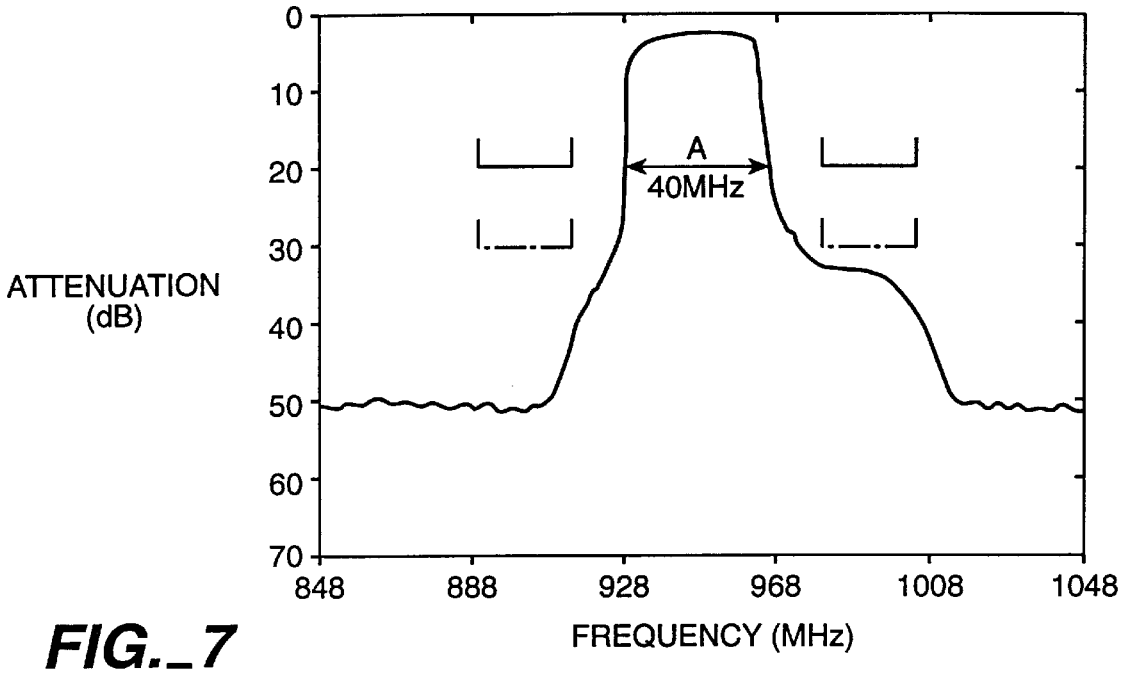
FIG. 7 is a graph which shows a characteristic curve of a SAW filter according to a second embodiment of this invention.

Although the invention has been described above with reference to only a small number of examples, these examples are intended to be illustrative, and not as limiting the scope of the invention. Many modifications and variations are possible within the scope of the invention. For example, FIG. 6 shows another filter 10 also embodying this invention and having two filter sections arranged parallel to each other and cascaded, each section being structured as explained above with reference to FIG. 1 and the two sections sharing a single input/output terminal 6. FIG. 7 shows an experimentally obtained characteristic curve of a filter having two filter sections connected to each other as shown in FIG. 6, each filter section being structured according to the second embodiment of this invention described above with the thickness-to-wavelength ratio $h/\lambda$ of the electrode film equal to 0.6 and being like prior art filters in other respects. FIG. 7 shows that the band width A at the attenuation level of 20 dB is 40 MHz, indicating an improvement by 16 MHz over the prior art example. The production error allowance, calculated similarly as explained above, is 9.5 MHz and this is about 6.3 times the value obtained for the prior art filter described above. FIG. 7 also shows that attenuation greater than 30 dB was obtained.

SAW filters having three or more filter sections connected together are also within the scope of this invention. Although examples with three sets of IDTs formed on a 36° Y-X $LiTaO_3$ substrate were shown above, there may be only two sets of IDTs or four sets on the substrate. In summary, the present invention teaches firstly that the thickness-to-wavelength ratio $h/\lambda$ of the electrode film should be between 0.06 and 0.1 for the electrode fingers of the reflectors and IDTs of a SAW filter of a prior art type, and secondly that the width-to-pitch ratio M/P of their electrode fingers be increased such that $M/P \geqq 0.6$. SAW filters thus designed have an improved shape factor and since the production error allowance is increased, they are easier to manufacture and their production cost is reduced.

What is claimed is:

1. A surface acoustic wave filter comprising:

a 36° Y-X $LiTaO_3$ substrate;

a plurality of interdigital transducers formed on said substrate; and reflectors formed on said substrate and sandwiching said interdigital transducers therebetween, said interdigital transducers and said reflectors comprising elongated electrode fingers, thickness h of said fingers being such that $0.06 \leqq h/\lambda \leqq 0.10$ where $\lambda$ is the wavelength of surface acoustic wave adapted to be generated by said filter, the fingers of said interdigital transducers having width M and being arranged at a constant pitch of P, M/P being a constant equal to or greater than 0.6, the ratio of passband width to center frequency of said filter being greater than 0.03.

2. The surface acoustic wave filter of claim 1 wherein the fingers of said reflectors are arranged at a constant pitch and have a constant width-to-pitch ratio.

3. A surface acoustic wave filter comprising:

a 36° Y-X $LiTaO_3$ substrate; and a plurality of filter sections formed parallel and cascaded to one another on said substrate, each of said filter sections comprising a plurality of interdigital transducers formed on said substrate and reflectors which are formed on said substrate and sandwich said interdigital transducers therebetween, said interdigital transducers and said reflectors comprising elongated electrode fingers, thickness h of said fingers being such that $0.06 \leqq h/\lambda \leqq 0.10$ where $\lambda$ is the wavelength of surface acoustic wave adapted to be generated by said filter, the fingers of said interdigital transducers having width M and being arranged at a constant pitch of P, M/P being a constant equal to or greater than 0.6, the ratio of passband width to center frequency of said filter being greater than 0.03.

4. The surface acoustic wave filter of claim 3 wherein the fingers of said reflectors are arranged at a constant pitch and have a constant width-to-pitch ratio.

*5. A surface acoustic wave filter comprising:*

*a piezoelectric substrate;*

*a plurality of interdigital transducers formed on said substrate; and*

*reflectors formed on said substrate and sandwiching said interdigital transducers therebetween, said interdigital transducers and said reflectors comprising elongated electrode fingers, a thickness h of said fingers being such that $0.06 \leqq h/\lambda \leqq 0.10$ where $\lambda$ is the wavelength of surface acoustic wave adapted to be generated by said filter, the fingers of said interdigital transducers having width M and being arranged at a constant pitch of P, M/P being a constant equal to or greater than about 0.6, the ratio of passband width to center frequency of said filter being greater than about 0.03.*

*6. The surface acoustic wave filter of claim 5, wherein the fingers of said reflectors are arranged at a constant pitch and have a constant width-to-pitch ratio.*

*7. The surface acoustic wave filter of claim 5, wherein the substrate is a $LiTaO_3$ substrate.*

*8. The surface acoustic wave filter of claim 5, wherein the substrate is a 36° Y-X substrate.*

*9. The surface acoustic wave filter of claim 5, wherein the substrate is a 36° Y-X $LiTaO_3$ substrate.*

*10. A surface acoustic wave filter comprising:*

*a piezoelectric substrate; and*

*a plurality of filter sections formed parallel and cascaded to one another on said substrate, each of said filter sections comprising a plurality of interdigital transducers formed on said substrate and reflectors which are formed on said substrate and reflectors which are formed on said substrate and sandwich said interdigital transducers therebetween, said interdigital transducers and said reflectors comprising elongated electrode fingers, thickness h of said fingers being such that $0.06 \leqq h/\lambda \leqq 0.10$ where $\lambda$ is the wavelength of surface acoustic wave adapted to be generated by said filter, the*

*fingers of said interdigital transducers having width M and being arranged at a constant pitch of P, M/P being a constant equal to or greater than about 0.6, the ratio of passband width to center frequency of said filter being greater than about 0.03.*

*11. The surface acoustic wave filter of claim 10, wherein the fingers of said reflectors are arranged at a constant pitch and have a constant width-to-pitch ratio.*

*12. The surface acoustic wave filter of claim 10, wherein the substrate is a $LiTaO_3$ substrate.*

*13. The surface acoustic wave filter of claim 10, wherein the substrate is a 36° Y-X substrate.*

*14. The surface acoustic wave filter of claim 10, wherein the substrate is a 36° Y-X $LiTaO_3$ substrate.*

*15. A surface acoustic wave filter comprising:*

*a $LiTaO_3$ substrate;*

*a plurality of interdigital transducers formed on said substrate; and*

*reflectors formed on said substrate and sandwiching said interdigital transducers therebetween, said interdigital transducers and said reflectors comprising elongated electrode fingers, a thickness h of said fingers being such that $0.06 \leqq h/\lambda \leqq 0.10$ where $\lambda$ is the wavelength of surface acoustic wave adapted to be generated by said filter, the fingers of said interdigital transducers having width M and being arranged at a constant pitch of P, M/P being a constant equal to or greater than about 0.6, the ratio of passband width to center frequency of said filter being greater than about 0.03.*

*16. The surface acoustic wave filter of claim 15, wherein the fingers of said reflectors are arranged at a constant pitch and have a constant width-to-pitch ratio.*

*17. The surface acoustic wave filter of claim 15, wherein the substrate is a 36° Y-X substrate.*

*18. A surface acoustic wave filter comprising:*

*a $LiTaO_3$ substrate;*

*a plurality of filter sections formed parallel and cascaded to one another on said substrate, each of said filter sections comprising a plurality of interdigital transducers formed on said substrate and reflectors which are formed on said substrate and reflectors which are formed on said substrate and sandwich said interdigital transducers therebetween, said interdigital transducers and said reflectors comprising elongated electrode fingers, thickness h of said fingers being such that $0.06 \leqq h/\lambda \leqq 0.10$ where $\lambda$ is the wavelength of surface acoustic wave adapted to be generated by said filter, the fingers of said interdigital transducers having width M and being arranged at a constant pitch of P, M/P being a constant equal to or greater than about 0.6, the ratio of passband width to center frequency of said filter being greater than about 0.03.*

*19. The surface acoustic wave filter of claim 18, wherein the fingers of said reflectors are arranged at a constant pitch and have a constant width-to-pitch ratio.*

*20. The surface acoustic wave filter of claim 19, wherein the substrate is a 36° Y-X substrate.*

* * * * *

UNITED STATES PATENT AND TRADEMARK OFFICE

CERTIFICATE OF CORRECTION

PATENT NO. : RE 37,102 P2
DATED : March 20, 2001
INVENTOR(S) : Yutaka Tada

It is certified that error appears in the above-identified patent and that said Letters Patent is hereby corrected as shown below:

Column 6,
Line 61, delete "and reflectors which are"
Line 62, delete "formed on said substrate"

Column 8,
Line 12, delete "and reflectors which are"
Line 13, delete "formed on said substrate"

Signed and Sealed this

Nineteenth Day of March, 2002

*Attest:*

*Attesting Officer*

JAMES E. ROGAN
*Director of the United States Patent and Trademark Office*